United States Patent
Guo et al.

(10) Patent No.: US 7,445,942 B2
(45) Date of Patent: Nov. 4, 2008

(54) PROCESS FOR MANUFACTURING SEGMENTED MRAM ARRAY WITH PATTERNED SEGMENTED MAGNETIC SHIELDS

(75) Inventors: Yimin Guo, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 410 days.

(21) Appl. No.: 11/182,255

(22) Filed: Jul. 15, 2005

(65) Prior Publication Data

US 2007/0012952 A1 Jan. 18, 2007

(51) Int. Cl.
*H01L 21/00* (2006.01)

(52) U.S. Cl. .............. 438/3; 257/659; 257/E21.665; 365/171

(58) Field of Classification Search .......... 438/195, 438/48, 3, 238, 381; 257/213, 422, 659, 257/295, 421, 423, 424, E21.665; 365/158, 365/171, 172, 173
See application file for complete search history.

(56) References Cited

U.S. PATENT DOCUMENTS

| | | | |
|---|---|---|---|
| 5,508,866 A * | 4/1996 | Gill et al. ............... | 360/327.2 |
| 6,335,890 B1 | 1/2002 | Reohr et al. ............. | 365/225.5 |
| 6,429,044 B1 | 8/2002 | Tuttle ..................... | 438/106 |
| 6,867,468 B2 | 3/2005 | Sharma et al. ............ | 257/421 |
| 6,921,965 B1 * | 7/2005 | Ray et al. ................ | 257/659 |
| 6,940,153 B2 * | 9/2005 | Spencer et al. ........... | 257/659 |
| 2002/0105058 A1 * | 8/2002 | Tuttle ..................... | 257/659 |
| 2004/0043519 A1 * | 3/2004 | Sharma et al. ............ | 438/3 |
| 2004/0126905 A1 | 7/2004 | Bhattacharyya et al. .... | 438/3 |
| 2004/0232536 A1 | 11/2004 | Fukuzumi ................ | 257/684 |
| 2005/0059170 A1 | 3/2005 | Min et al. ................ | 438/3 |

OTHER PUBLICATIONS

Rudolf F. Graf, Mordern Dictiona of Electronics, 1999, Seventh Edition, p. 74.*

* cited by examiner

*Primary Examiner*—Wael Fahmy
*Assistant Examiner*—Eva Montalvo
(74) *Attorney, Agent, or Firm*—Saile Ackerman LLC; Stephen B. Ackerman

(57) ABSTRACT

A second shield layer, under the master shielding layer, is added to a segmented MRAM array. This additional shielding is patterned so as to provide one shield per bit slice. The placement of longitudinal biasing tabs at the ends of these segmented shields ensures that each segmented shield is a single magnetic domain, making it highly effective as a shield against very small stray fields.

10 Claims, 3 Drawing Sheets

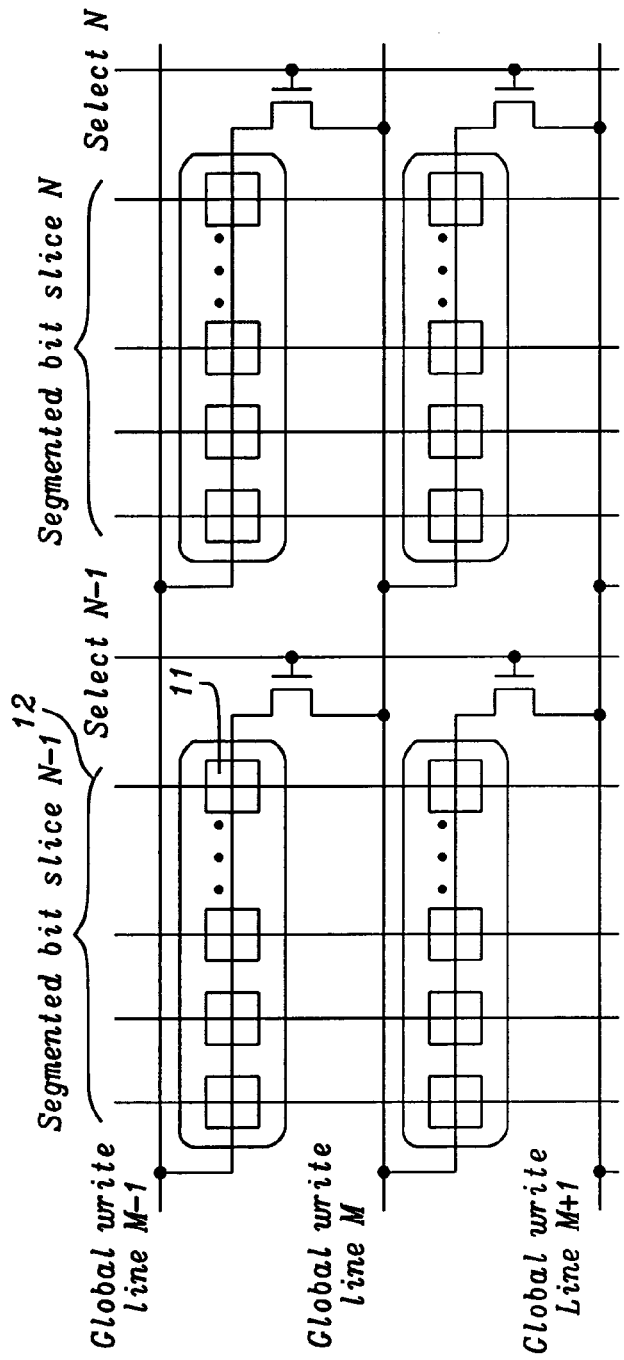
FIG. 1 – Prior Art
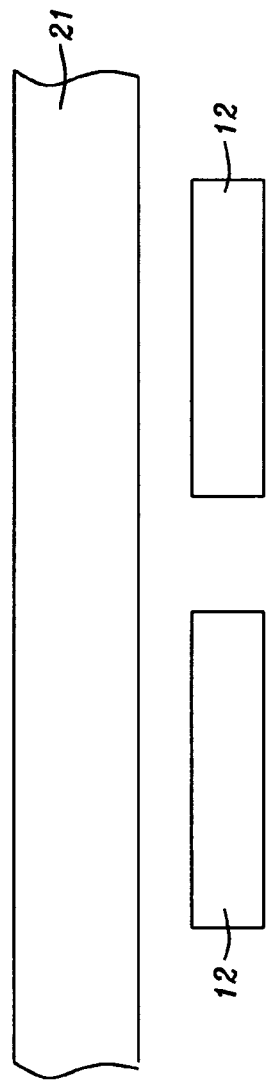
FIG. 2 – Prior Art

PROCESS FOR MANUFACTURING SEGMENTED MRAM ARRAY WITH PATTERNED SEGMENTED MAGNETIC SHIELDS

FIELD OF THE INVENTION

The invention relates to the general field of magnetic random access memories (MRAMs) with particular reference to shielding said MRAMs from very low magnetic fields.

BACKGROUND OF THE INVENTION

All magnetic memory arrays are provided with magnetic shields to exclude any influence from external magnetic fields. In practice, however, no continuous shield layer can be 100% perfect and even adding additional continuous shielding layers would not help to avoid the degradation of MRAM operational margin due to external stray magnetic fields.

This is especially true for a segmented bit line scheme, an example of which is shown in FIG. 1. Seen there is an array of magnetic memory elements such as element 11 which is a MTJ (magnetic tunnel junction) or a GMR (giant magneto resistance) device. Passing vertically (in the figure) across each memory element is a single bit line which intersects a horizontal word line so that a given element is addressed only when both these lines are simultaneously activated. In the segmented design shown here, the bit lines are segmented into groups, or bit slices, such as 12, and additional select lines are provided so that only the word lines within a given bit slice are powered up at any given time.

MRAMs using MTJs are strong candidate to provide a dense (areas of 8-25 $f^2$, where f is the smallest feature size), fast (1-30 ns read/write speed), and non-volatile storage solution for future memory applications. The MTJ utilizes at lease 2 magnetic layers, that sandwich a thin dielectric layer such as $Al_2O_3$, $AlN_xO_y$, or MgO with one magnetic layer being pinned by an antiferromagnetic film. To protect data from being erased or from thermal agitation, an in-plane uniaxial magnetic anisotropy is needed for the magnetic free layer to store data.

The cross point of Word Line and Bit Line currents programs the MTJs of the MRAM cells. The problem of the cells along the same word line and bit lines being disturbed is a major concern. The Segmented Word Line arrangement, as described in reference (1) below, eliminated disturb conditions of cells on the same word line outside the selected segment. When the operating point is chosen deep along the hard axis, the required bidirectional bit line currents to program the selected cells are significantly reduced. The possibility of disturbance along the bit line is also reduced. This represents an ideal MRAM operating condition.

The switching fields generated by word line and bit line currents for the conventional MRAM are about 20-50 Oe in intensity. For the segmented word line scheme, the bias field generated by the write word line is about 30-50 Oe while the switching field generated by a bit line is about 10 Oe. Magnetic fields of higher intensity are often encountered in everyday life. For example, magnetic fields generated by telephone receivers. Furthermore, if MRAMs are manufactured using a conventional package approach, the problem also occurs. Due to the increase in density in packaging techniques, in an environment in which the MRAM is actually used, power lines or the like may have to pass by elements. Then, possible leakage magnetic fields may destroy stored data.

Accordingly, measures must be taken to protect the MRAM from these stray magnetic fields. Typically, as seen in cross-section in FIG. 2, the MRAM array will be covered by permeable layer 21, such as a thick NiFe layer. This magnetic soft layer reduces the effects of stray magnetic fields on the MRAM. But this may not provide perfect shielding. First, magnetic domains are very difficult to arrange/control in order to shield MRAMs from external stray fields in both hard axis and easy axis directions. Second, magnetic domains and domain walls in the shielding magnetic soft layer could generate additional small stray field on its covered MRAM cells.

These problems are different for the segmented word line scheme: In the hard axis direction, the biasing field generated by a write word line is large and therefore can tolerate small stray field without affecting writing margin; but in the easy axis direction, the switching field generated by a bit line is very small and easily interrupted by small stray fields, thereby reducing the MTJ free layer switching margin.

Alternatively, different magnetic shield measures have been proposed which are carried out during the packaging step utilizing a powdered magnetic substance (3,4). However, these arrangements tend to complicate the packaging technique and may also generate unwanted non-uniform stray fields on the MRAM. A different approach to dealing with the approach is disclosed as part of the present invention.

A routine search of the prior art was performed with the following additional references of interest being found:

In U.S. Pat. No. 6,335,890, (Roehr et al. disclose global and local word lines where the global word lines are isolated from the memory cells, write lines and bit lines orthogonal, and a switch for each word line segment. In U.S. Pat. No. 6,429,044, Tuttle describes a shield partially or completely surrounding an integrated circuit. There may be multiple shields or overlapping shields.

U.S. Pat. No. 6,867,468 (Sharma et al.) shows a magnetic shield above and below the bit plane. The magnetic shield may be patterned. U.S. patent application Ser. No. 2004/0,126,905 (Bhattacharyya et al.) teaches a metal shield over each layer of memory cells or over all memory cells.

Fukuzumi discloses a magnetic shield surrounding a magnetic element in U.S. patent application Ser. No. 2004/0,232,536. Min et al., shows a shield to fit each MTJ cell in U.S. patent application Ser. No. 2005/0,059,170 (made to a common assignee as the present invention).

SUMMARY OF THE INVENTION

It has been an object of at least one embodiment of the present invention to provide a segmented MRAM array that is fully protected against stray magnetic fields.

Another object of at least one embodiment of the present invention has been to provide a process for manufacturing said segmented MRAM array.

Still another object of at least one embodiment of the present invention has been that said process not require the introduction of significant modifications to existing processes for manufacturing MRAM arrays.

These objects have been achieved by the introduction of patterned segmented shields in addition to the more conventional master shielding layer. While the master shielding layer effectively suppresses most external stray fields, a small leakage field at a level of less than 3 Oe may still remain. The newly added segmented shields provide an even better shielding effect since (as a key feature of the invention) they comprise single magnetic domains which protect against leakage fields along the direction of the bit line current. Thus, switching fields generated by the bit line current will not be interrupted at all, thereby preserving the writing margin from degradation

BRIEF DESCRIPTION OF THE DRAWINGS

FIG. 1 shows a segmented MRAM array of the prior art.
FIG. 2 is a schematic cross-sectional view of FIG. 1.

DESCRIPTION OF THE PREFERRED EMBODIMENTS

The principal novel feature of the present invention is the addition to the MRAM design of a series of patterned (segmented) thin magnetic shields in addition to the more conventional thick master magnetic shielding layer. Each segmented array block (or segmented bit line slice) of MTJs, comprising 16 or 32 bit lines and 512 or 1024 (or even more) write word lines, is separated from adjacent segmented array blocks by a distance of more than 10 microns.

Figures 3, 4:
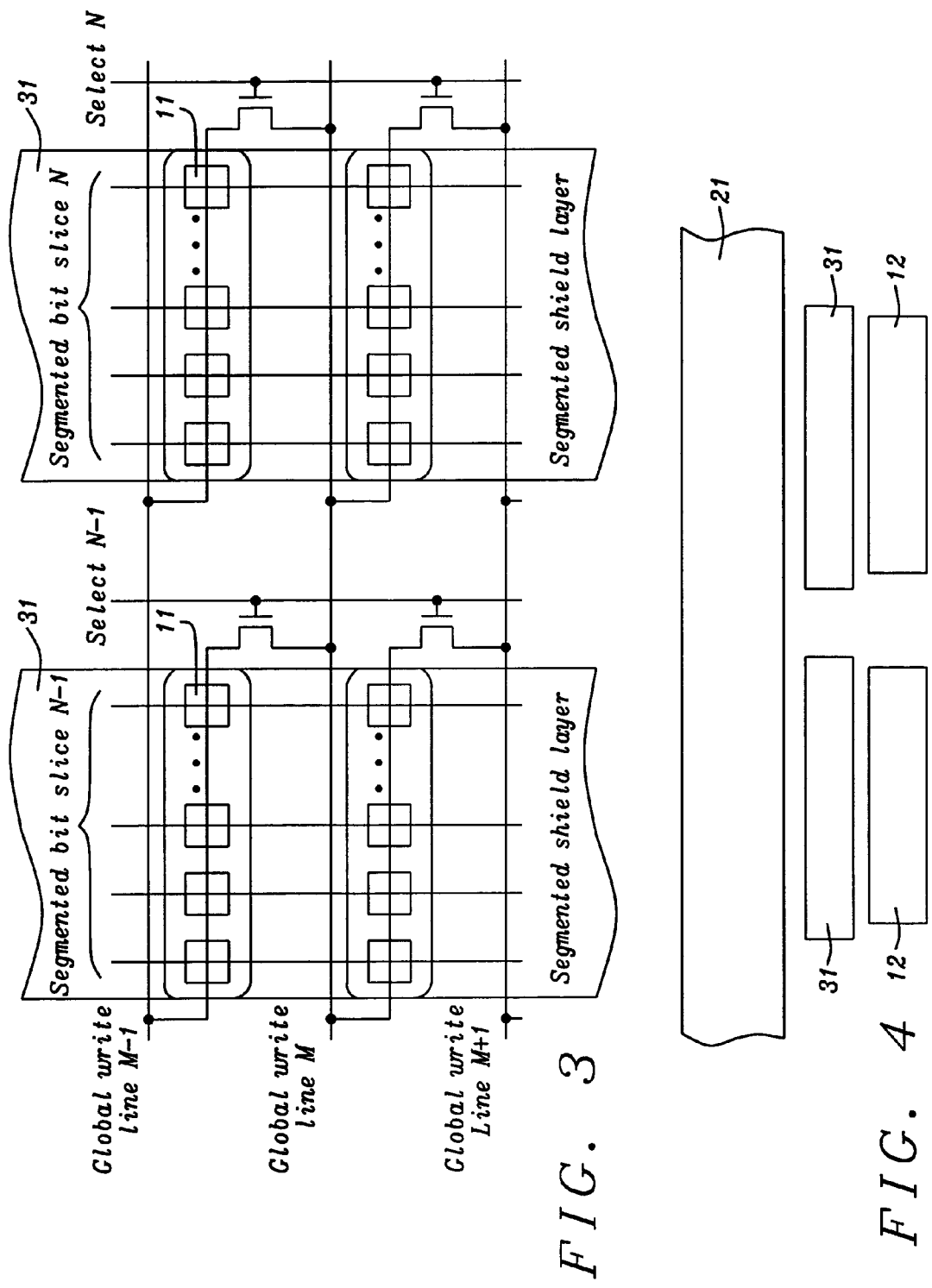
FIG. 3 shows a segmented MRAM array as improved by the present invention.
FIG. 4 is a schematic cross-sectional view of FIG. 3

In FIG. 3, typical segmented word line array blocks and their patterned shields are shown. After a thick (~200 nm) dielectric layer coating on top of the MRAM arrays (not shown), a soft magnetic layer is deposited and patterned into parallel rectanglular segmented shields 31. All the MTJ cells in each segmented bit line slice are covered by a single segmented shield. The spacing between adjacent shields is at least 5 microns and the shortest distance from the edge of each shield to its covered MTJ cells (i.e. the amount of overlap) is at least 1 micron.

In FIG. 4, a schematic cross-section of typical segmented word line array blocks 12, patterned shields 31 and master shield 21 are shown. After the first soft magnetic shielding layer is patterned, a dielectric layer of a few microns thick is deposited and then the master shielding layer is deposited by plating processes and patterned to cover the entire MTJ module. The thickness of the master shielding layer ranges from 5 to 20 microns.

Figure 5:
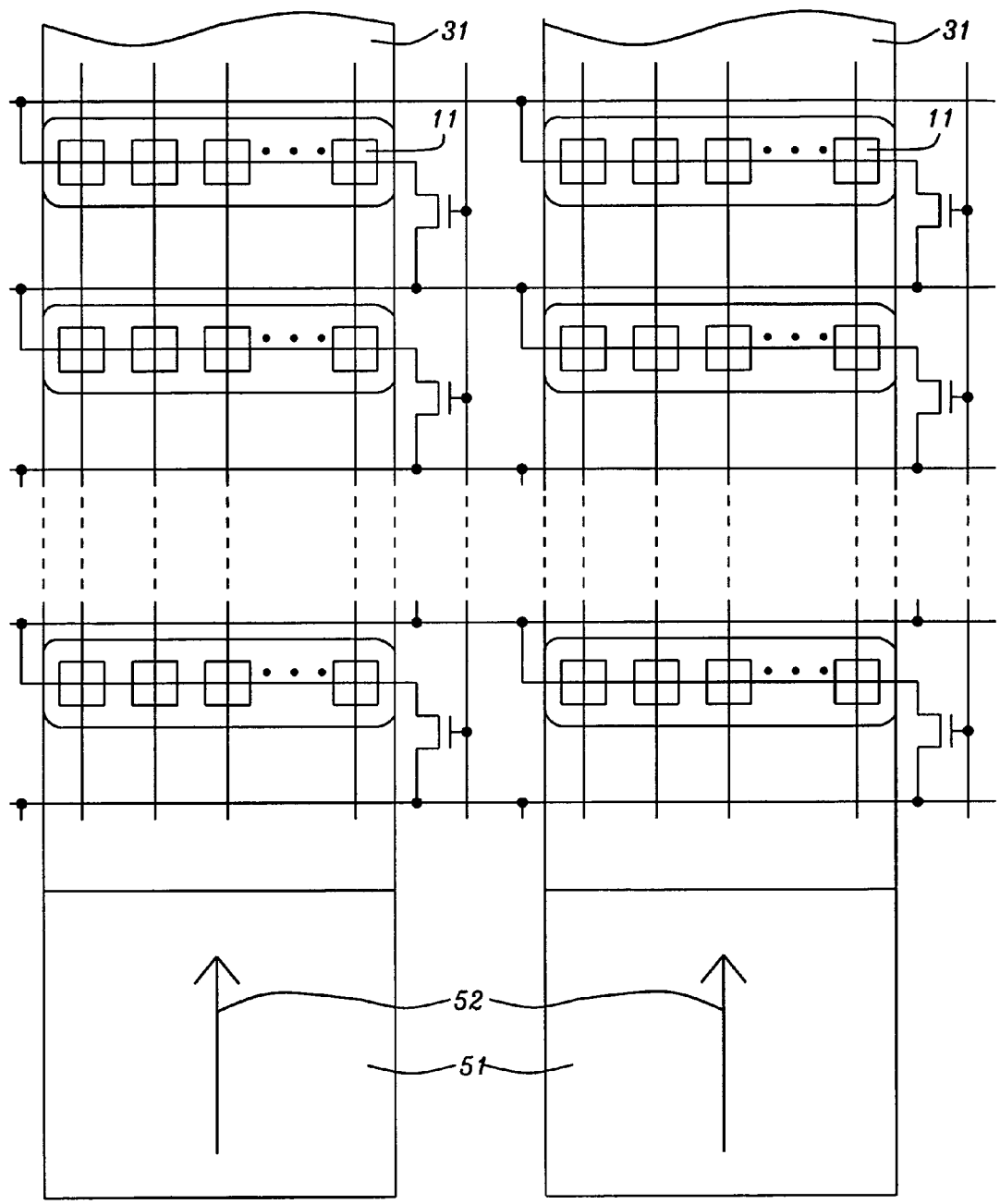
FIG. 5 illustrates the application of longitudinal bias to a segmented shield.

As shown in FIG. 5, for each segmented shield, AFM (antiferromagnetic) exchange pinning pads (or hard biasing pads) 51 are deposited and patterned on both their longitudinal ends in order to maintain a single domain states in which all magnetization is aligned along a single longitudinal direction 52 (similar to the longitudinal bias in GMR read heads).

In a conventional design, with only a single (master) shielding layer, most external stray fields are suppressed but a small leakage field at a level of less than 3 Oe may still remain. The addition of the segmented shielding layer provides a perfect shield against the leakage field perpendicular to bit line current direction. Therefore, the switching field generated by bit line currents will not be interrupted at all, keeping writing margin from degradation.

We now provide a description of a process to manufacture the structure described above. The process begins with the provision of a segmented MRAM array, that includes between about 64 and 1,024 bit slice segments each of which contains between about 8 and 128 bit lines. Additionally, as part of said MRAM array, between about 64 and 1,024 word lines are provided, each such word line being independently addressable whereby it can interact with one and only one of said bit slice segments at any given time.

A dielectric layer is then deposited on the array's surface followed by the deposition of a layer of soft magnetic material which is patterned to form a plurality of segmented shields each of which fully covers and overlaps one of the bit slice segments on both sides (by between about 0.5 and 5 microns), said segmented shields being spaced between about 3 and 15 microns apart from one another. Typically, the segmented shields are deposited to a thickness between about 500 and 5,000 Angstroms and are selected from the group consisting of all ferrimagnetic and soft ferromagnetic materials including NiFe, NiCo, and CoFeB.

To ensure that each segmented shield is, and remains, a single magnetic domain, a pad of longitudinal magnetic biasing material is depositing at each of its ends. Each such biasing pad overlaps its associated segmented shield but does not overlap any part of its associated bit slice segment. Examples of the biasing pads are schematically shown as pads 51 in FIG. 5.

The biasing pads may be applied in one of two ways: pad 51 may be formed from a magnetically hard material (such as CoPt or CoTaPt), in which case its bias is magnetostatically coupled to the shield; or it may be formed from an antiferromagnetic material (such as IrMn or PtMn), in which case it can be antiferromagnetically coupled to the segmented shield.

Regardless of how biasing is to be achieved, the biasing pads are magnetized parallel (or antiparallel) to direction 52 in FIG. 5 after a suitable magnetic anneal (for example, heating at a temperature of between about 150 and 250° C. for between about 5 and 60 minutes in a magnetic field of between about 100 and 2,000 Oe). As long as the portion of the segmented shield under the pads remains magnetized, as shown, the remaining portions of each segmented shield will continue to be similarly magnetized because of shape anisotropy.

The process concludes with the deposition of a second dielectric layer (not shown) to fully cover all exposed surfaces followed by the deposition of master magnetic shield layer 21 (see FIG. 4).

What is claimed is:

1. A process for providing effective magnetic shielding for a segmented MRAM array, having a top surface, comprising:

providing, as part of said MRAM array, a number of bit slice segments each of which contains a number of bit lines;

further providing, as part of said MRAM array, a number of word lines, each such word line being independently addressable whereby it can interact with one and only one of said bit slice segments at any given time;

depositing a first dielectric layer on said array top surface;

then depositing a layer of soft magnetic material on said first dielectric layer;

patterning said soft magnetic layer to form a plurality of segmented shields each of which fully covers and overlaps one of said bit slice segments, said segmented shields being spaced a distance apart from one another;

providing each segmented shield with two ends and depositing at each of said ends a biasing pad of magnetic material capable of applying a longitudinal magnetic bias, said biasing pad overlapping its associated segmented shield without overlapping any part of its associated bit slice segment;

then depositing a second dielectric layer to fully cover all exposed surfaces;

by means of a magnetic anneal, establishing said longitudinal bias, whereby each segmented shield becomes a single magnetic domain; and depositing a master magnetic shield layer over said second dielectric layer.

2. The process recited in claim 1 further comprising each of said biasing pads being a magnetically hard material, whereby said longitudinal bias is achieved through magnetostatic coupling.

3. The process recited in claim 1 further comprising each of said biasing pads being an antiferromagnetic material, whereby said longitudinal bias is achieved through exchange coupling.

4. The process recited in claim 1 wherein said number of bit slice segments is between about 64 and 1,024, said number of bit lines in each bit slice segment is between about 8 and 128, and said number of word lines is between about 64 and 1,024.

5. The process recited in claim 1 wherein said MRAM further comprises an array of MTJ elements.

6. The process recited in claim 1 wherein said MRAM further comprises an array of GMR elements.

7. The process recited in claim 1 wherein each of said segmented shields is deposited to a thickness between about 500 and 5,000 Angstroms and is selected from the group consisting of all ferrimagnetic materials and all soft ferromagnetic materials, including NiFe, NiCo, and CoFeB.

8. The process recited in claim 1 wherein each of said segmented shields overlaps its associated bit slice segment, on both sides, by between about 0.5 and 5 microns.

9. The process recited in claim 1 wherein said distance between adjacent segmented shields is between about 3 and 15 microns.

10. The process recited in claim 1 wherein said magnetic anneal further comprises heating at a temperature of between about 150 and 250° C. for between about 5 and 60 minutes in a magnetic field of between about 100 and 2,000 Oe.

* * * * *